United States Patent [19]
Miske et al.

[11] Patent Number: 5,963,080
[45] Date of Patent: Oct. 5, 1999

[54] UNDERSHOOT HARDENED FET SWITCH

[75] Inventors: Myron J. Miske, Newfields, N.H.; Trenor F. Goodell, Peaks Island, ME.

[73] Assignee: Fairchild Semiconductor Corporation, South Portland, ME.

[21] Appl. No.: 09/219,403

[22] Filed: Dec. 23, 1998

[51] Int. Cl.$^6$ ..................................... H03K 3/01
[52] U.S. Cl. .................. 327/534; 327/388; 327/535; 327/437; 327/391
[58] Field of Search ................................ 327/534, 388, 327/439, 535, 437, 379, 377, 391

[56] References Cited

U.S. PATENT DOCUMENTS

| | | | |
|---|---|---|---|
| 5,808,502 | 9/1998 | Hui et al. | 327/333 |
| 5,880,620 | 3/1999 | Gitlin et al. | 327/388 |

*Primary Examiner*—Dinh T. Le
*Attorney, Agent, or Firm*—Pierce Atwood; Chris A. Caseiro

[57] ABSTRACT

A bus switch for transferring logic signals between nodes without the problems associated with undershoot conduction. The bus switch is an FET switch including a single primary transfer transistor. The bulk of the transfer transistor is coupled to a bulk regulating circuit including a pseudo low-potential power rail. The pseudo low-potential rail is coupled to one arbiter circuit associated with one of the two circuit transfer nodes and a second arbiter circuit associated with the other of the two transfer nodes. The arbiter circuits are coupled to their respective nodes or pads and to a common low-potential supply rail. The arbiter selects for coupling to the pseudo low-potential rail the signal of the lower potential between that at the pad and that of the low-potential rail. This arrangement ensures that there will be no parasitic conduction of the transfer transistor during undershoot conditions. In an alternative embodiment that may be used to minimize the vagaries associated with process variations, the transfer transistor's gate may be independently coupled to a second pseudo low-potential power rail.

16 Claims, 7 Drawing Sheets

FIG 8C

UNDERSHOOT HARDENED FET SWITCH

BACKGROUND OF THE INVENTION

1. Field of the Invention

The present invention relates to electronic switches. In particular, the present invention relates to semiconductor switches, including those formed of one or more metal-oxide-semiconductor (MOS) transistors. More particularly, the present invention relates to N-type MOS (NMOS) field effect transistor (FET) bus switches.

2. Description of the Prior Art

Developments in semiconductor technology have created the capability to produce low-cost, highly reliable switches that are, effectively, implementations of mechanical relays. They have been found to be of particular use, when implemented, as single pole, single throw, type relays, but are not limited thereto. Semiconductor switches are being used more and more as replacements for the prior mechanical relays, due to the high switching speed available as well as their ability to transfer relatively high currents without failure. These switches are often referred to as transfer gates or pass transistors as they employ the characteristics of transistors—usually MOS transistors—to either permit or prevent the passage of a signal.

It is well known that switches are widely used in many fields. They are used in all variety of large- and small-scale consumer products, including, but not limited to, automobiles and home electronics. They can be and are used as analog routers, gates, and relays. They are used as digital multiplexers, routers, and gates as well.

A number of prior-art transfer gates have been developed for digital and analog applications. Recent innovations have provided methods for operation at lower power supply potentials such as 3.3 Volts and 2.5 Volts, while providing some method of maintaining isolation when input values go beyond high- and low-potential power rail values. That is, when a transfer gate input potential exceeds the high-potential rail Vcc positively, or it exceeds the low-potential rail GND negatively. One such device that has been in relatively common use is shown in FIG. 1

A complementary pair of transistors, NMOS transistor M1 and PMOS transistor M2 conduct signals between nodes A and B, where each of those nodes is couplable to an extended circuit. When a control signal OEN (shown in FIG. 1 associated with node A as the input for purposes of illustration only, but which can also be associated with node B as the input) is a logic "high" or "1," transistor M1 is turned on, and as a result of the inversion produced by inverter I1, transistor M2 is also on. In this condition, the two transistors are "on" and the potential at node B is essentially the same as the potential at node A. When OEN is at a logic "low" or "0," both transistors are off and there exists a high impedance for the transfer of any signal between nodes A and B. This is true for all potentials at node A or B that are less than the potential of high-potential power rail Vcc and greater than low-potential power rail GND. However, when either the input or the output node is greater than Vcc or less than GND, the potential associated with the typical logic low at the gate of transistor M1 and a typical logic high at the gate of M2 is insufficient to keep those transistors off. For a potential greater than Vcc, M2 will turn on, for a potential less than GND, M1 will turn on, irrespective of the logic level applied at input OEN. As a result, an overvoltage condition at either the input or the output will cause M1 and M2 to permit a signal to pass through that the OEN deems should be blocked. An undervoltage condition will likewise be passed under the same OEN condition.

For the purpose of this disclosure, the terms "overvoltage" and "undervoltage" mean the potential variations noted that occur under static (DC) conditions as well as dynamic (AC) conditions. For that reason, overvoltage may be used interchangeably with overshoot. Similarly, undervoltage may be used interchangeably with undershoot. Passage of any of those conditions when OEN deems such conditions should be blocked is undesirable.

Figure 1:
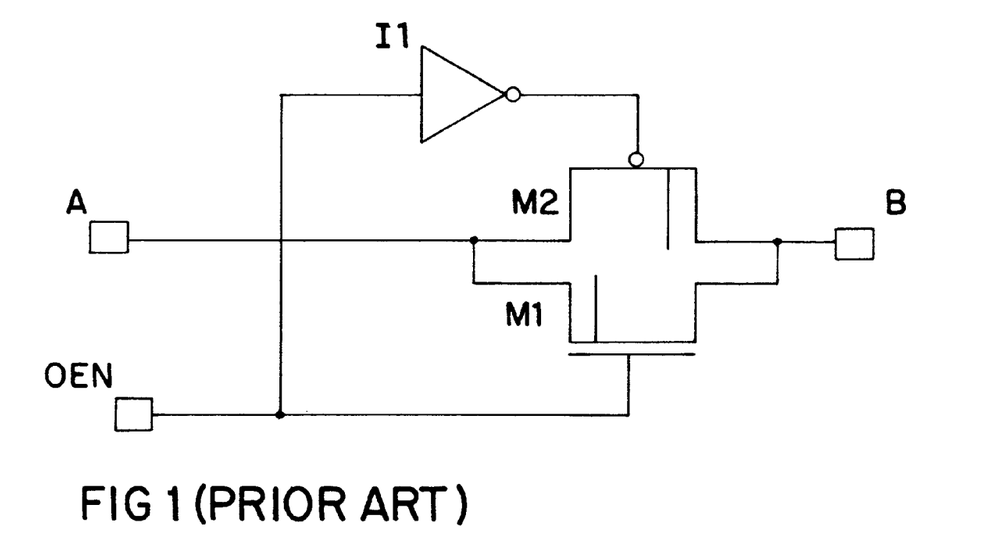
FIG. 1 is a simplified schematic diagram of a prior-art transfer gate having a CMOS transistor pair as the primary transfer element of the transfer device.
Figure 2:
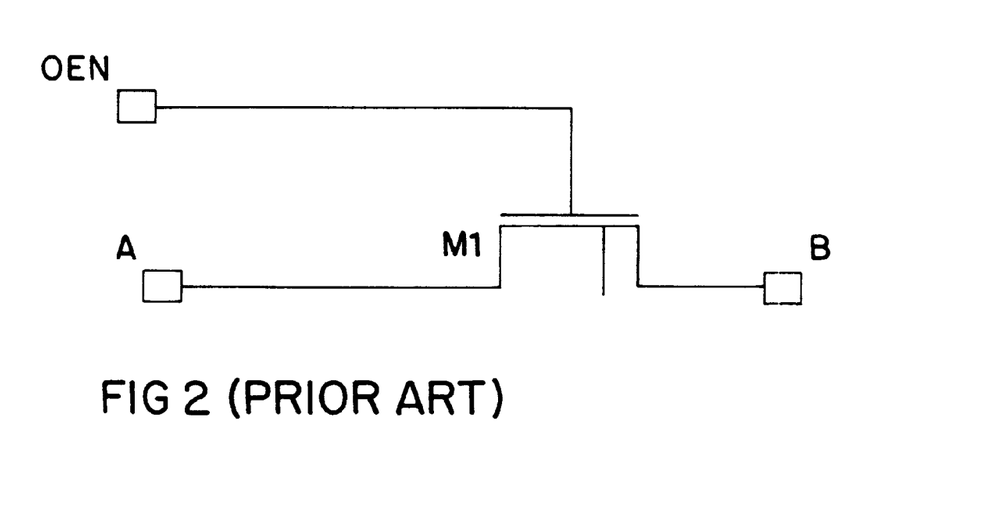
FIG. 2 is a simplified schematic diagram of a prior-art transfer gate having a single enhancement-mode NMOS transistor as the transfer device.

A device designed to resolve at least one portion of the problems associated with the complementary transfer gate of FIG. 1 is shown in FIG. 2. The device involves removal of PMOS transistor M2, leaving NMOS transistor M1 coupled between nodes A and B, where node A is the input from, or output to, a first extended circuit, and node B is the input from, or output to, a second extended circuit. As before, control node OEN is designed to control enablement of M1. In operation, a logic level high from OEN to the gate of M1 renders M1 on and thereby permits a signal to pass between nodes A and B. A logic level low turns M1 off and blocks the transfer of the signal between A and B. Elimination of transistor M2 resolves the problem when the potential at node A or node B exceeds Vcc because that transistor is not there to be turned on. Unfortunately, that does not eliminate the possibility that the transfer gate will turn on when it should be off under conditions of negative voltage exceeding GND.

Figure 3:
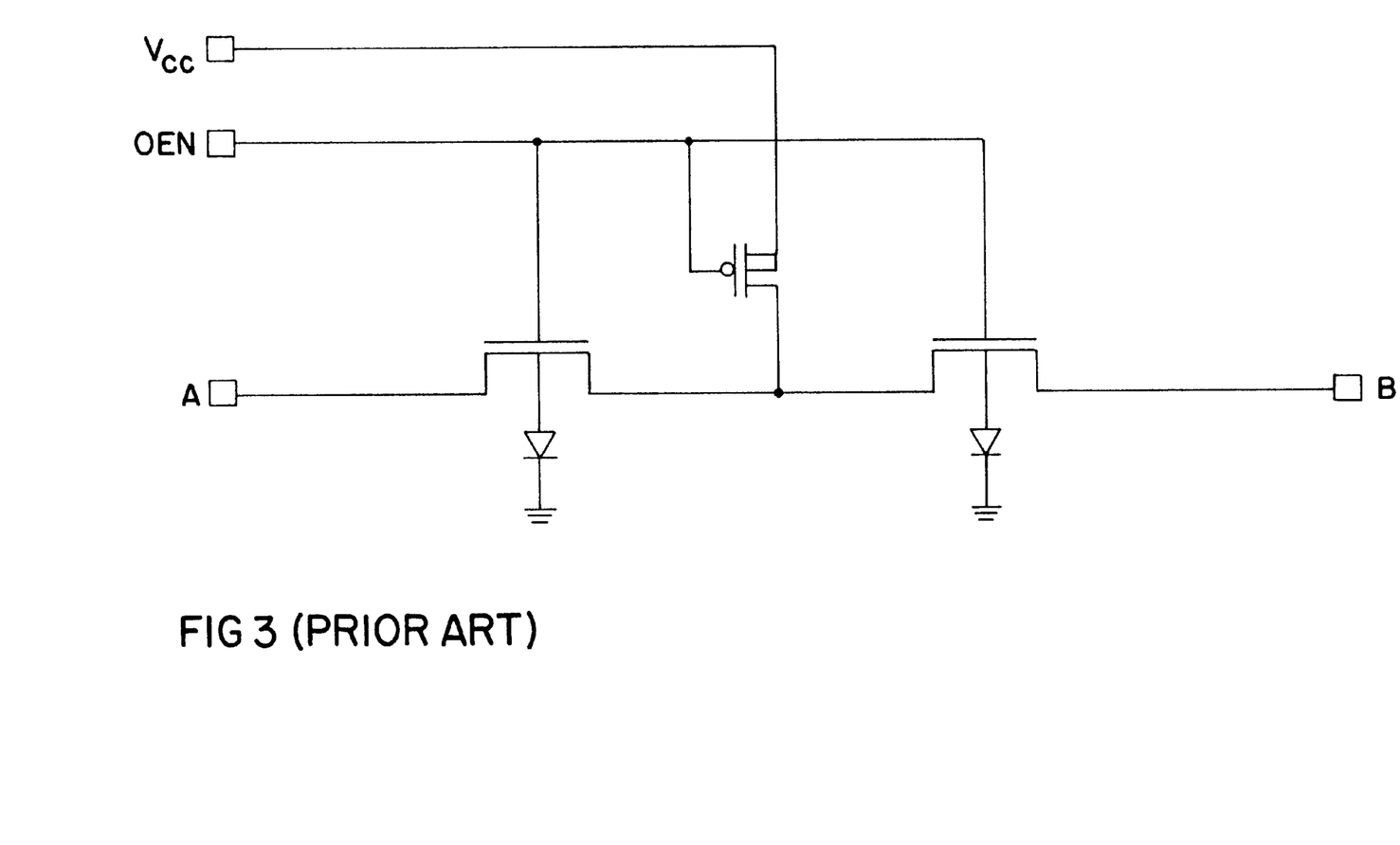
FIG. 3 is a simplified diagram of a prior-art transfer gate having a series of MOS transistors as the primary transfer components of the transfer device.

An alternative and more complex prior transfer gate is shown in FIG. 3. That device includes a series pair of NMOS pass transistors. When OEN transmits a logic low or "off" signal, the circuit of FIG. 3 will remain off, even when Vcc and GND are exceeded. Thus, this circuit is a reasonable alternative to the circuit shown in FIG. 2. However, the effective drain-source resistance $R_{DS}$ associated with using the two NMOS transistors in series is several hundred ohms dependent upon the particular characteristics and coupling of the transistors. While that resistance is acceptable in analog devices, it is not so in digital systems where the RC time constant is a critical consideration in the rate of operation of a circuit. Therefore, this transfer gate would not be particularly suitable for digital circuitry that operates at increasingly faster rates.

U.S. Pat. No. 5,808,502 issued to Hui et al. describes some of the problems noted in association with one-transistor and two-series transistors used to transfer selected signals between nodes or pads. Hui provides a solution of increasing the potential supplied to the gates of the transistors through the use of a charge pump. Such a solution has its own problems, including the noise problem that Hui seeks to solve through the addition of a capacitor coupled to the charge pump. However, the Hui solution involves the use of series transistors to maintain isolation. Series transistor approaches penalize the user since the capacitance of the enabled series transistor transfer gate is much higher than that of a single transistor transfer gate. The capacitances of both FET devices are present on the I/O ports of the transfer gate.

It would be desirable to have a transfer gate operating with a single NMOS transistor as the FET switch substantially as shown in the circuit of FIG. 2. This would address the problems of relatively high resistance and relatively high capacitance experienced at the output of the switch circuit when the circuit is substantially as shown in FIG. 3. However, the prior single NMOS switch of FIG. 2 is unacceptable during undershoot conditions in that there is a parasitic diode connected between either the source or drain of the transistor and its bulk. The bulk is tied to the low-potential power rail usually identified as ground. During voltage undershoot conditions at the low-potential rail, the parasitic diode conducts current from ground to either the input node or the output node, depending upon which is at a potential that is less than ground potential. Under that condition, current will move from the output node to the input node, thereby causing a disruption of signal transmission otherwise occurring at the output node. This can occur independent of the condition of the enable signal at OEN.

Two characteristics of the physical structure of the single NMOS FET switch cause this clearly undesirable parasitic conduction condition. The first is the formation of a parasitic bipolar NPN transistor. The second is the unintended turning on of the NMOS FET switch in certain undershoot situations. With regard to the first condition, the drain (N-type collector), transistor bulk (P-type base), and source (N-type emitter) form the NPN transistor. Transistor fabrication steps currently in use in sub-micron processes can yield in this common-base parasitic bipolar transistor a current gain that is the equivalent of a common-emitter gain ($\beta$) of about 10. Thus, during an undershoot condition, the relatively small current moving from the low-potential rail to the more negative input node yields a ten-fold increase in the undesired parasitic current moving from the output node to the input node. Of course, in an ideal FET switch there should be no current flowing from the output node to the input node unless specifically enabled.

The other undesirable condition associated with the parasitic diode of the prior single-FET switch relates to the unintended turning on of the FET switch during an undershoot event. Specifically, this occurs when there is enough current generated in the substrate of the transistor to cause a voltage drop in the transistor's bulk that is enough to turn the transistor on. If the current developed between the low-potential rail and a lower-potential circuit node causes a drop across the substrate/bulk resistance that is at least the equivalent of the threshold turn-on potential $V_{TN}$ of the transistor, the transistor will conduct current from one circuit node to the other.

It may be seen that it is necessary to isolate the primary FET bulk from ground when the switch is disabled in order to prevent the parasitic NPN bipolar transistor condition. However, in order to address the second problem condition, it is necessary to keep the primary transistor's gate potential substantially the same as its bulk potential. Therefore, what is needed is a FET switch which resolves both problems. What is also needed is such a FET switch that offers less resistance and capacitance than prior switches. Yet further, what is needed is a FET switch that preferably takes up less chip space than prior switches.

SUMMARY OF THE INVENTION

It is an object of the present invention to provide a semiconductor circuit that acts as a switch for digital and analog operations. It is also an object of the present invention to provide a semiconductor switch that is a transfer gate or pass gate operable for a broad range of supply voltages, including supply voltages of less than five volts. It is a further object of the present invention to provide a transfer gate circuit that remains operable in the manner intended during undershoot conditions. Included as part of that object is the goal to provide a FET switch that isolates the primary FET bulk from ground when the switch is disabled in order to prevent a parasitic NPN bipolar transistor condition. A further goal is to keep the primary transistor's gate potential substantially the same as or lower than its bulk potential. Finally, it is an object to provide such an FET switch circuit with reduced resistance and capacitance characteristics and that optimizes the performance for the user.

These and other objectives are achieved in the present invention through the arrangement of a set of MOS transistors coupled together, to the high- and low-potential power rails, and to the input and output nodes of the circuit such that isolation, under control of the OE signal, of a primary FET switch that is the input/output transfer device is achieved under all input/output voltage conditions. In summary, a single NMOS transistor of the prior art shown in FIG. 2 is used as the switch. Coupled to that single NMOS transistor are two potential arbiter sub-circuits, and a bulk potential coupling sub-circuit. The first arbiter sub-circuit regulates the potential of the bulk of the primary switch transistor in relation to the potential at a first (input or output) circuit node. The second arbiter circuit regulates the transistor's bulk potential in relation to the potential at a second (output or input) circuit node. The bulk potential coupling sub-circuit chooses which arbiter sub-circuit is used to drive the pseudo-low potential power rail that is coupled to the primary switch transistor bulk node. These arbiter sub-circuits and bulk potential coupling sub-circuit are designed to ensure that the lower of the two potentials associated with the low-potential power rail and the input to be transferred, whether node A to node B or node B to node A, is used as the supply to a pseudo low-potential power rail that is in turn coupled to the bulk of the primary switch transistor of the present invention. Thus, the bulk of the primary switch or transfer transistor of the present invention will always be at the lowest potential possible and therefore will not develop either of the parasitic conduction conditions described.

The circuit of the present invention further includes a controller circuit designed to link the gate of the transfer transistor to the enable signal in a way that ensures complete operational capability of the bus switch under all conditions. In particular, the controller circuit preferably is an inverter having its output coupled to the transfer transistor's gate, and a low-potential node that is coupled to the pseudo low-potential rail. The output of the inverter is also preferably coupled to a bulk potential coupling circuit that ensures standard operation of the bus switch when enabled.

These and other advantages of the present invention will become apparent upon review of the following detailed description of the embodiments of the invention, the accompanying drawings, and the appended claims.

BRIEF DESCRIPTION OF THE DRAWINGS

FIG. 7 including

FIG. 8 including

DETAILED DESCRIPTION OF THE PREFERRED EMBODIMENTS OF THE INVENTION

Figure 4:
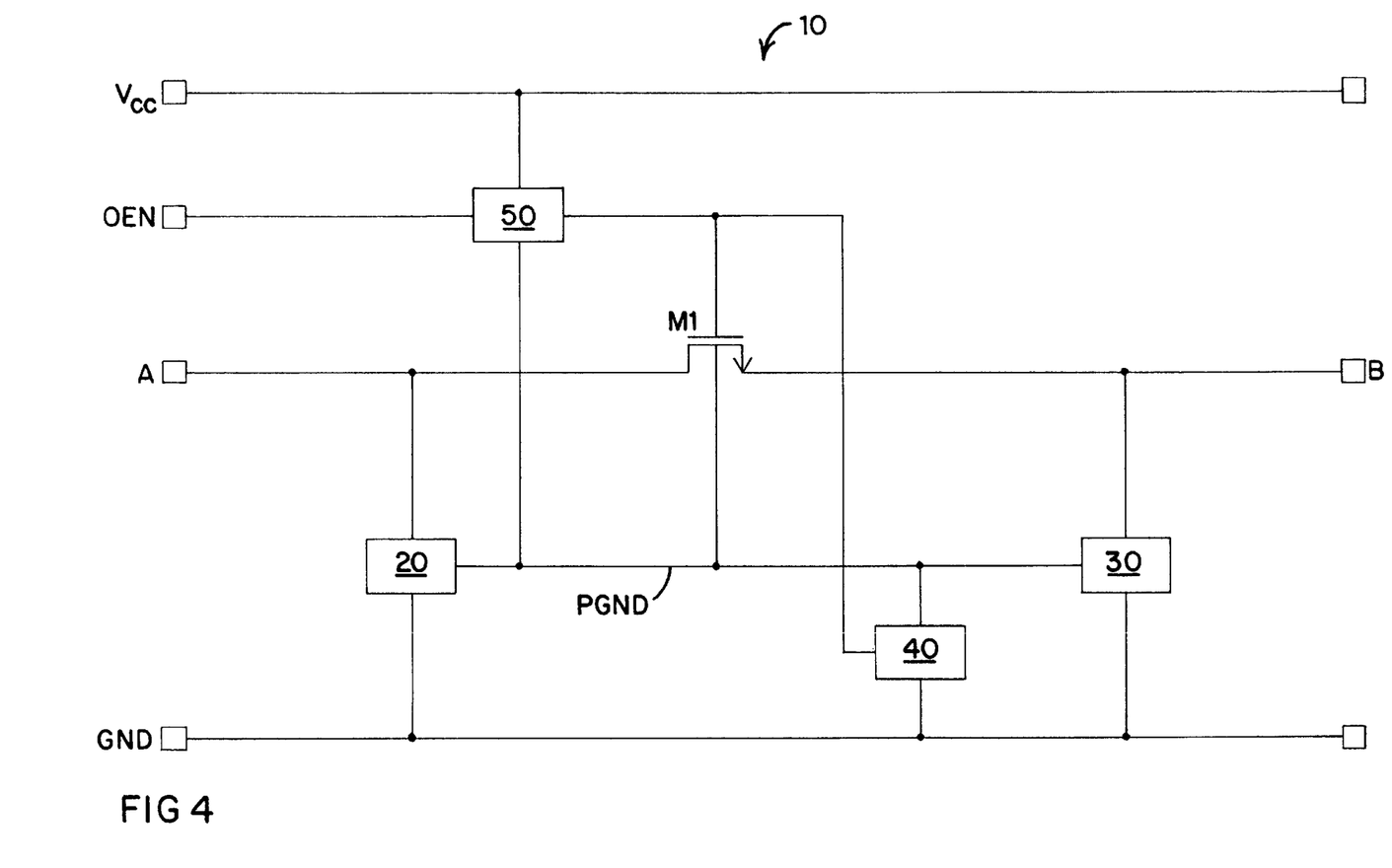
FIG. 4 is a schematic block diagram of the undershoot tolerant FET switch circuit of the present invention, showing an NMOS transistor in combination with a pair of arbiter sub-circuit blocks and a bulk driver sub-circuit block as the primary transfer components of the bus switch that is couplable to an extended circuit.

An undershoot-hardened bus switch 10 of the present invention is shown in FIG. 4. The switch 10 includes a first arbiter circuit 20, a second arbiter circuit 30, a pseudo low-potential rail PGND, a bulk potential coupling circuit 40, and transfer transistor M1. Enable controller circuit 50, supplied by a standard high-potential power rail Vcc, is used to define a selectable signal to activate the transfer transistor M1. An enable signal coming from a control circuit (not shown) by output enable node OEN is preferably coupled to the gate of M1 and the pseudo-low potential power rail PGND through circuit 50. Transistor M1 is the primary regulator of the transfer of a signal between nodes A and B. It is preferably an N-type MOS transistor formed with an isolated P-type well. Either of node A or node B may be an input node or an output node, dependent upon the direction of the signal passing between the external circuitry coupled to those two nodes.

In order to take full advantage of the use of a single transfer transistor in the bus switch 10 without the disadvantages associated with the prior-art switch of FIG. 3, the bulk of M1 is coupled to the pseudo low-potential rail PGND. Arbiters 20 and 30 combined with bulk potential coupling circuit 40 define the potential of PGND as always being the lower of the potential at node A, node B, or GND. It is to be noted that the circuit is designed such that the bulk of M1 is "protected" regardless of whether undershoot occurs at node A or node B. Specifically, first arbiter circuit 20 is coupled to node A and GND with means to select the lower potential associated with those two references to transmit to the bulk coupling circuit 40. Similarly, second arbiter circuit 30 is coupled to node B and GND with means to select the lower potential associated with those two references to transmit to the bulk potential coupling circuit 40. Bulk potential coupling circuit 40 senses node A, node B, and the output of circuit 50, to drive the pseudo-low potential power rail PGND to the lower of the potential at node A, node B, or GND.

The circuit 10 shown in FIG. 4 blocks parasitic conduction caused by the bipolar effect of transistor M1 through the connection of the bulk of M1 to PGND and the arrangement of circuits 20 and 30. Bipolar parasitic conduction would otherwise occur during undershoot events occurring at both node A and node B. However, since the bulk of M1, which is the equivalent of the base of the parasitic bipolar transistor, will be at the lowest potential of either node, and therefore lower than the potential at GND during the undershoot event, there is insufficient potential to cause a turning on of that device. The circuit 10 is also designed to prevent the parasitic conduction that can otherwise occur when field effect potential is sufficient within M1 to cause a gate to bulk potential exceeding Vt. In particular, this is accomplished by referencing the controller circuit 50 to PGND rather then to GND. The controller circuit 50 is designed such that when M1 is supposed to be disabled, its gate is coupled to its bulk, ensuring that it cannot be turned on. Additionally, when the signal at OEN triggers activation of M1, circuit 50 is designed to turn on transistor M5 inside circuit 40. Transistor M5 is coupled between PGND and GND so as to tie them together in that situation, thereby allowing a full swing potential across the gate-bulk channel of M1. That allows standard operation of the circuit 10 under active conditions. Under disable conditions, transistor M5 is driven similar to transistor M1, such that the gate and bulk are tied to PGND.

Figure 5:
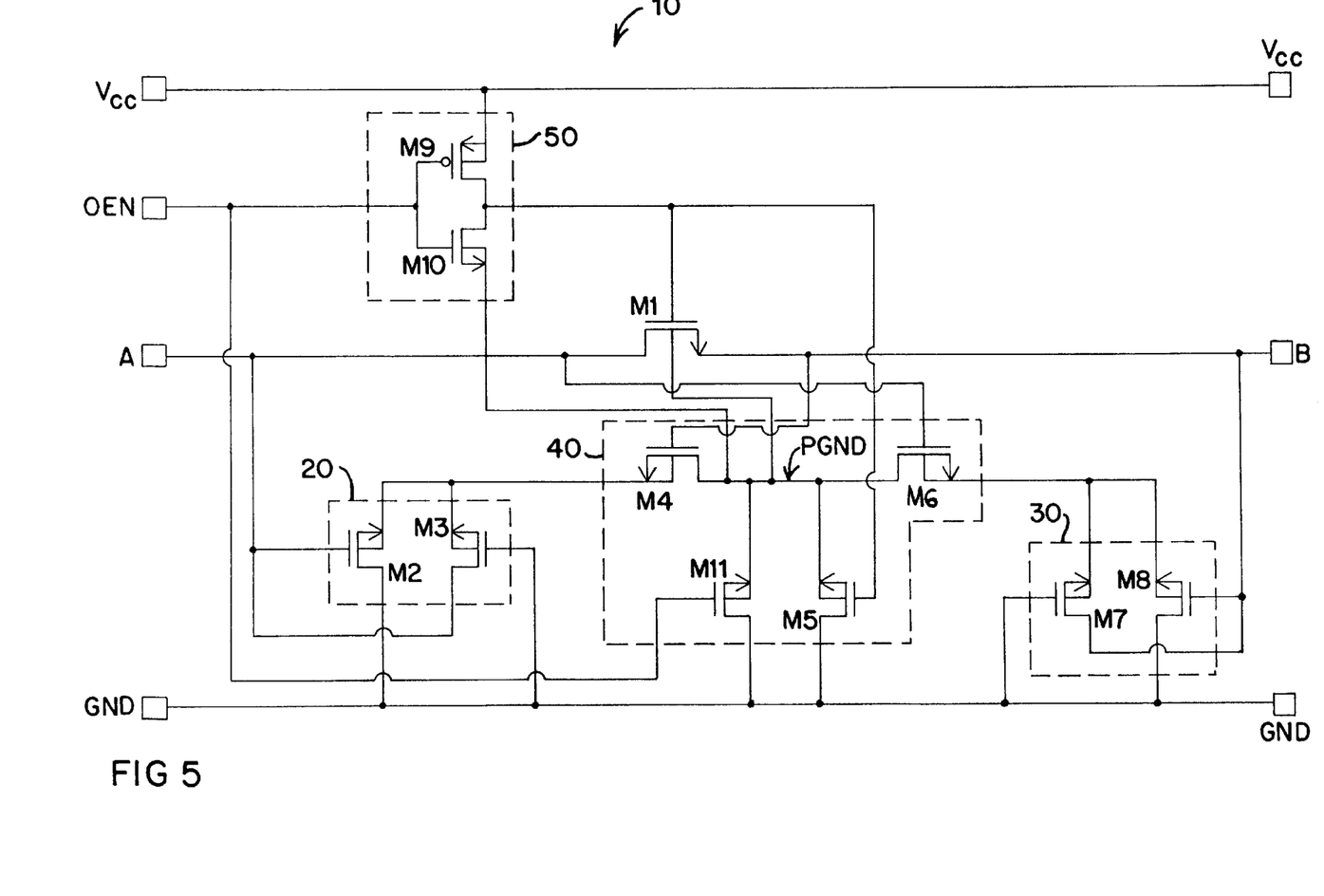
FIG. 5 is a schematic diagram of the undershoot tolerant FET switch circuit of the present invention, with details of the arbiter sub-circuit components.

A first design of the circuit 10 of the present invention is shown in FIG. 5. It includes the transfer transistor M1 having its source coupled to A and its drain coupled to B. The gate of M1 is coupled to the output of controller circuit 50. Controller circuit 50 includes PMOS transistor M9 and NMOS transistor M10. Transistor M9 has its source coupled to Vcc, its gate to OEN, and its drain tied to the drain of M10 and to the gate of M1. Transistor M10 has its source coupled to PGND, its gate to OEN, and its drain coupled to the drain of M9 and the gate of M1.

With continuing reference to FIG. 5, first arbiter circuit 20 includes transistors M2-M3. Transistor M2 has its gate coupled to node A, its drain coupled to GND, and its source coupled to circuit 40. Transistor M3 has its gate coupled to GND, its drain coupled to node A, and its source coupled to circuit 40. It can be seen through the arrangement of the two transistors of arbiter circuit 20 that the lower potential of either of GND or node A will be transferred to the bulk potential coupling circuit 40. When GND potential is higher than node A potential, transistor M3 is conducting and it passes the signal at node A to circuit 40. When node A potential is higher than GND potential, transistor M2 is conducting and it couples the potential of GND to circuit 40.

Second arbiter circuit 30 is designed as a mirror image of first arbiter circuit 20. It includes transistors M7-M8. Transistor M8 has its gate coupled to node B, its drain coupled to GND, and its source coupled to circuit 40. Transistor M7 has its gate coupled to GND, its drain coupled to node B, and its source also coupled to circuit 40. It can be seen through the arrangement of the two transistors of arbiter circuit 30 that the lower potential of either of GND or node B will be transferred through to the bulk potential coupling circuit 40. When GND potential is higher than node B potential, transistor M7 is conducting and it passes the signal at node B to circuit 40. When node B potential is higher than GND potential, transistor M8 is conducting and it couples the potential of GND to circuit 40.

Bulk potential coupling circuit 40 includes transistors M4-M6 and M11. Transistor M4 has its gate coupled to node B, its drain coupled to PGND, and its source and bulk coupled to circuit 20. Transistor M6 has its gate coupled to node A, its drain coupled to PGND, and its source and bulk coupled to circuit 30. The configuration of transistors M4 and M6 ensures that the potential associated with the arbiter circuit coupled to the pad having the lower potential at undershoot will be supplied to PGND. Transistor M5 having its gate coupled to the output of controller circuit 50, its source and bulk coupled to PGND, and its drain coupled to GND. When the circuit 10 is enabled through the introduction of a logic low at OEN, or other suitable logic means, transistor M5 provides a low impedance path between potential rails PGND and GND that ensures standard FET bus switch operation. Transistor M11 has its gate coupled to node OEN, its drain coupled to GND, and its source and bulk coupled to PGND. Transistor M11 is preferable a very narrow device, such that it presents a relatively high impedance path even when enabled by OEN. Alternative implementations of transistor M11 may be that of a high-valued resistor, or other such device. The configuration of M11 serves to couple PGND to GND through this high-impedance path when OEN dictates that the primary transfer transistor M1 is disabled. This high impedance coupling is necessary to maintain a low potential on PGND in the event that both node A and node B are at GND potential. During an undershoot event, transistor M4 or M6 can easily overdrive this high impedance coupling.

Figure 6:
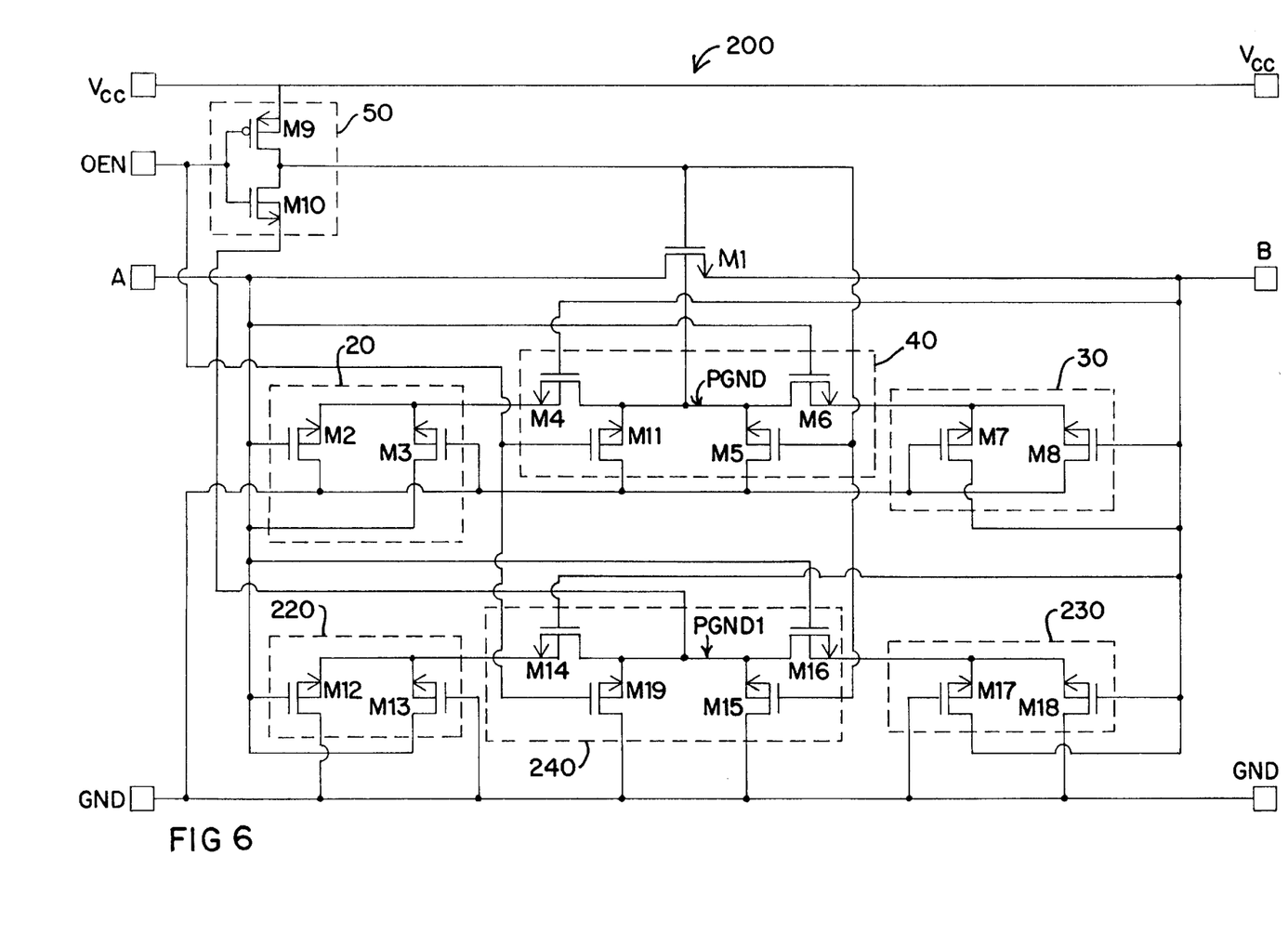
FIG. 6 is a schematic diagram of an alternative arrangement of the undershoot tolerant FET switch of the present invention, showing a separated bulk driver and gate driver sub-circuit configuration.

An alternative design of the bus switch of the present invention is shown in FIG. 6 with reference to circuit 200. Alternative circuit 200 may be used to reduce sensitivity to higher order effects in practical implementations. In the circuit 200, components that are the same as those shown in FIG. 5 are given the same component numbers. In addition, related third arbiter circuit 220, fourth arbiter circuit 230, and a transfer transistor gate coupling circuit 240 ensure that the gate of transistor M1 is completely isolated from the bulk of that transistor. In the circuit 10 of FIG. 5, the gate of transistor M1 was tied to the gate of transistor M5, thereby linking the gate of M1 through circuit 40 to pseudo rail PGND that defines the potential at the bulk of M1. In the alternative embodiment of FIG. 6, the bulk of M1 remains tied to PGND through circuit 40; however, the gate of M1 is now tied to isolated circuit 240 and its pseudo low-potential power rail PGND1.

In addition to those like components previously described with reference to FIG. 5, the circuit 200 includes circuits 220, 230, and 240, as noted. Circuit 220 includes transistors M12-M13. Transistor M12 has its gate coupled to node A, its drain coupled to GND, and its source coupled to circuit 240. Transistor M13 has its gate coupled to GND, its drain coupled to node A, and its source also coupled circuit 240. It can be seen through the arrangement of the two transistors of arbiter circuit 220 that the lower potential of either of GND or node A will be transferred to the gate coupling circuit 240. When GND potential is higher than node A potential, transistor M13 is conducting and it passes the signal at node A to circuit 240. When node A potential is higher than GND potential, transistor M12 is conducting and it couples the potential of GND to circuit 240.

Fourth arbiter circuit 230 is designed as a mirror image of third arbiter circuit 220. It includes transistors M17-M18. Transistor M18 has its gate coupled to node B, its drain coupled to GND, and its source coupled to circuit 240. Transistor M17 has its gate coupled to GND, its drain coupled to node B, and its source also coupled to circuit 240. It can be seen through the arrangement of the two transistors of arbiter circuit 230 that the lower potential of either of GND or node B will be transferred through to the gate coupling circuit 240. When GND potential is higher than node B potential, transistor M17 is conducting and it passes the signal at node B to circuit 240. When node B potential is higher than GND potential, transistor M18 is conducting and it couples the potential of GND to circuit 240.

Gate potential coupling circuit 240 includes transistors M14–M16 and M19. Transistor M14 has its gate coupled to node B, its drain coupled to PGND1, and its source and bulk coupled to circuit 220. Transistor M16 has its gate coupled to node A, its drain coupled to PGND1, and its source and bulk coupled to circuit 230. The configuration of transistors M14 and M16 ensures that the potential associated with the arbiter circuit coupled to the pad having the lower potential at undershoot will be supplied to PGND. Transistor M15 having its gate coupled to the output of controller circuit 50, its source and bulk coupled to PGDN1, and its drain coupled to GND. When the circuit 200 is enabled through the introduction of a logic low at OEN, or other suitable logic means, transistor M15 provides a low impedance path between potential rails PGDN1 and GND that ensures standard FET bus switch operation. Transistor M19 has its gate coupled to node OEN, its drain coupled to GND, and its source and bulk coupled to PGDN1. Transistor M19 is preferable a very narrow device, such that it presents a relatively high impedance path even when enabled by OEN. The configuration of M19 serves to couple PGDN1 to GND through this high-impedance path when OEN dictates that the primary transfer transistor M1 is disabled. This high impedance coupling is necessary to maintain a low potential on PGND1 in the event that both node A and node B are at GND potential. During an undershoot event, transistor M14 or M16 can easily overdrive this high impedance coupling. Alternative implementations of transistor M19 may be that of a high-valued resistor, or other such device.

Figure 7A:
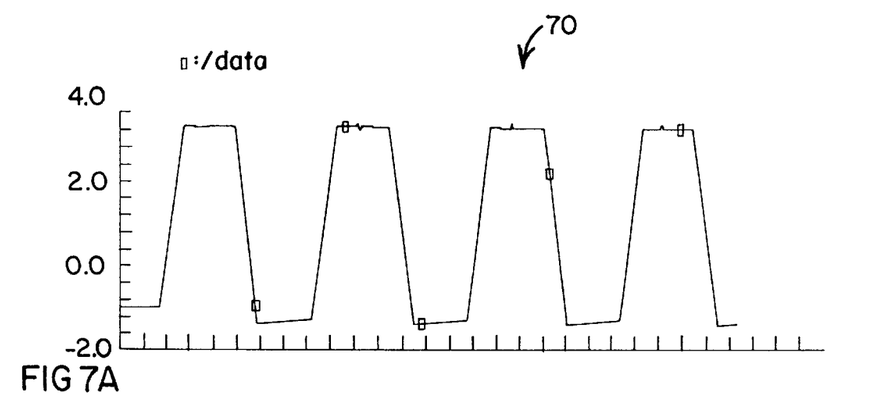
FIGS. 7A–7C shows a series of waveforms related to the inability of the prior-art transfer circuit of FIG. 2 to block parasitic conduction of an undershooting signal when the transfer circuit is supposed to be disabled.
Figure 7B:
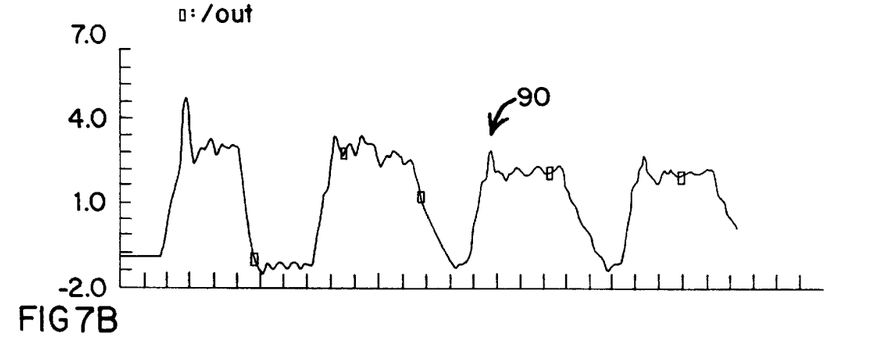
Figure 7C:
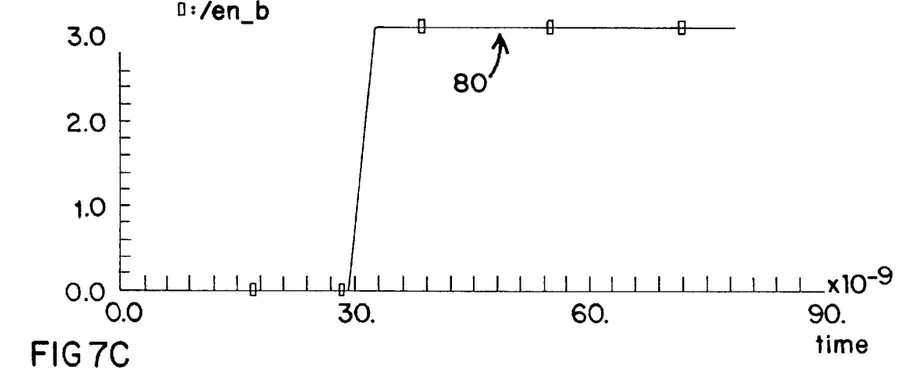
Figure 8A:
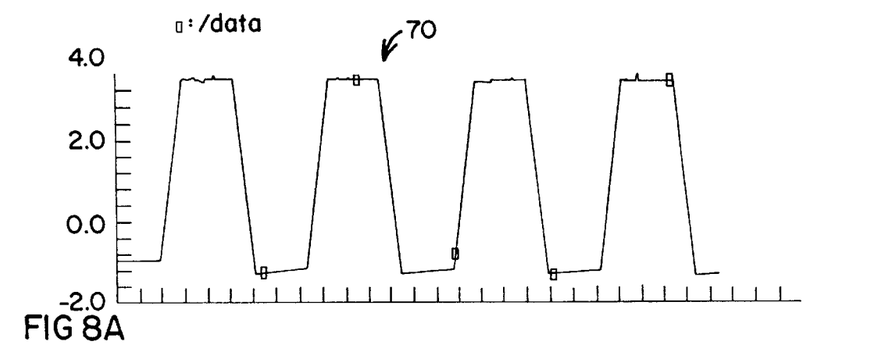
FIGS. 8A–8C shows a series of waveforms related to the undershoot blocking capability of the bus switch of the present invention.
Figure 8B:
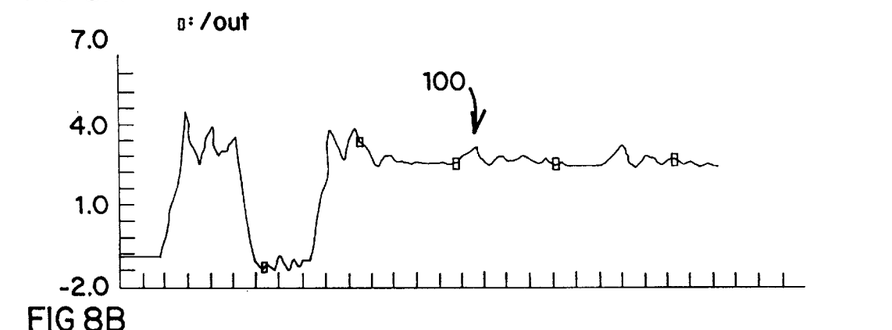
Figure 8C:
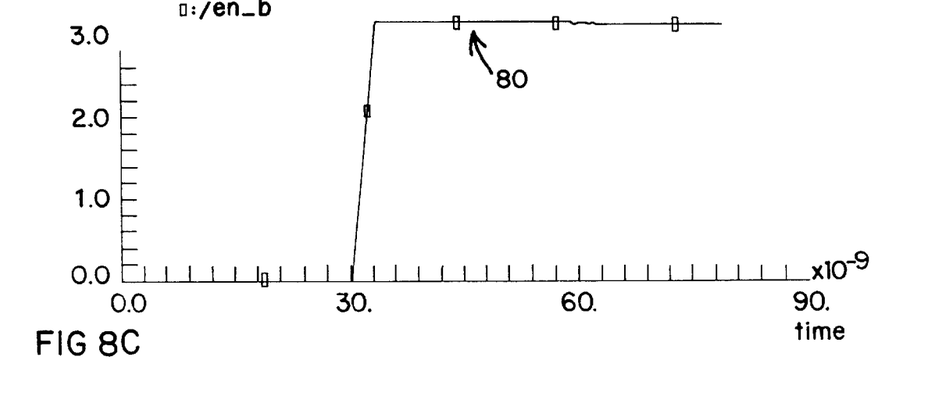

The advantages of the circuits 10 and 200 of the present invention can be seen in a comparison of the waveforms shown in FIGS. 7 and 8. FIG. 8 relates to a bus switch circuit of the prior art such as the circuit shown in FIG. 2. FIG. 8 relates to the circuit 10 of the present invention. In FIGS. 7A and 8A, a standardized switching signal with intentional undershoot is shown as waveform 70. In the evaluation of the prior circuit and the present invention, this standardized undershooting signal was transmitted to the first signal pad, node A. In FIGS. 7C and 8C, a standardized enable signal is shown as waveform 80. When that enable signal is the equivalent of a logic high (approximately 3.0 V in FIGS. 7C and 8C) transmitted to the gate of the transfer transistor or transistors of either the prior-art circuit or the circuit of the present invention, the bus switch is supposed to be disabled and the waveform 70 should not be transferred from node A to node B. FIGS. 7B and 8B show the waveforms of the output signals obtained at node B in this particular example. It can be seen by waveform 90 in FIG. 7B that the prior-art transfer circuit continues to conduct at its output the undershooting condition even when the switch is supposed to be disabled. Conversely, the circuit 10 of the present invention blocks signal conduction during the undershoot conditions when it is disabled. The present invention therefore provides a clear advantage over the prior art.

While the present invention has been described with specific reference to particular embodiments, it is to be understood that all modifications, variants, and equivalents are deemed to be within the scope of the following appended claims.

What is claimed is:

1. An undershoot-hardened bus switch for regulating a transfer of a logic signal between a first node and a second node, wherein the logic signal is transferred from the first node to the second or from the second node to the first, said bus switch comprising:

a. an enable signal node for receiving a bus switch activation signal;

b. a MOS transfer transistor having a gate coupled to said enable signal node, a source coupled to the first node, and a drain coupled to the second node;

c. a first arbiter circuit having a first input coupled to the first node and a second input coupled to a low-potential power rail;

d. a second arbiter circuit having a first input coupled to the second node and a second input coupled to said low-potential rail; and e. a pseudo low-potential power rail coupled to said output of said first arbiter circuit, to said output of said second arbiter circuit, and to a bulk region of said transfer transistor.

2. The bus switch as claimed in claim 1 wherein said MOS transfer transistor is an NMOS transistor.

3. The bus switch as claimed in claim 2 further comprising a controller circuit having an input coupled to said enable signal node and an output coupled to said gate of said NMOS transfer transistor.

4. The bus switch as claimed in claim 3 wherein said controller circuit includes a PMOS transistor having a gate coupled to said enable signal node, a source coupled to a high-potential power rail, and a drain coupled to said gate of said transfer transistor, and an NMOS transistor having a gate coupled to said enable signal node, a drain coupled to said gate of said transfer transistor, and a source coupled to said pseudo low-potential power rail.

5. The bus switch as claimed in claim 1 wherein said first arbiter circuit includes:
   a. a first NMOS transistor having a gate coupled to the first node, a drain coupled to said low-potential rail, and a source coupled to said pseudo low-potential power rail; and
   b. a second NMOS transistor having a gate coupled to said low-potential rail, a drain coupled to the first node, and a source coupled to said pseudo low-potential power rail.

6. The bus switch as claimed in claim 5 wherein said second arbiter circuit includes:
   a. a first NMOS transistor having a gate coupled to the second node, a drain coupled to said low-potential rail, and a source coupled to said pseudo low-potential power rail; and
   b. a second NMOS transistor having a gate coupled to said low-potential rail, a drain coupled to the second node, and a source coupled to said pseudo low-potential power rail.

7. The bus switch as claimed in claim 1 further comprising a bulk potential coupling circuit having a control node coupled to said enable control node, wherein said bulk potential coupling circuit is coupled between said low-potential rail and said pseudo low-potential rail.

8. The bus switch as claimed in claim 7 wherein said bulk potential coupling circuit includes an NMOS transistor having a gate coupled to said enable signal control node, a drain coupled to said low-potential rail, and a source coupled to said pseudo low-potential rail.

9. An undershoot-hardened bus switch for regulating a transfer of a logic signal between a first node and a second node, wherein the logic signal is transferred from the first node to the second or from the second node to the first, said bus switch comprising:
   a. an enable signal node for receiving a bus switch activation signal;
   b. a MOS transfer transistor having a gate coupled to said enable signal node, a source coupled to the first node, and a drain coupled to the second node;
   c. a first arbiter circuit having a first input coupled to the first node and a second input coupled to a low-potential power rail;
   d. a second arbiter circuit having a first input coupled to the second node and a second input coupled to said low-potential rail;
   e. a third arbiter circuit having a first input coupled to the first node and a second input coupled to a low-potential power rail;
   f. a fourth arbiter circuit having a first input coupled to the second node and a second input coupled to said low-potential rail;
   g. a first pseudo low-potential power rail coupled to said output of said first arbiter circuit, to said output of said second arbiter circuit, and to a bulk region of said transfer transistor; and
   h. a second pseudo low-potential power rail coupled to said output of said third arbiter circuit, to said output of said fourth arbiter circuit, and to a gate of said transfer transistor.

10. The bus switch as claimed in claim 9 wherein said MOS transfer transistor is an NMOS transistor.

11. The bus switch as claimed in claim 10 further comprising a controller circuit having an input coupled to said enable signal node and an output coupled to said gate of said NMOS transfer transistor.

12. The bus switch as claimed in claim 11 wherein said controller circuit includes a PMOS transistor having a gate coupled to said enable signal node, a source coupled to a high-potential power rail, and a drain coupled to said gate of said transfer transistor, and an NMOS transistor having a gate coupled to said enable signal node, a drain coupled to said gate of said transfer transistor, and a source coupled to said pseudo low-potential power rail.

13. The bus switch as claimed in claim 9 wherein said first arbiter circuit includes:
   a. a first NMOS transistor having a gate coupled to the first node, a drain coupled to said low-potential rail, and a source coupled to said first pseudo low-potential power rail; and
   b. a second NMOS transistor having a gate coupled to said low-potential rail, a drain coupled to the first node, and a source coupled to said first pseudo low-potential power rail.

14. The bus switch as claimed in claim 13 wherein said second arbiter circuit includes:
   a. a first NMOS transistor having a gate coupled to the second node, a drain coupled to said low-potential rail, and a source coupled to said first pseudo low-potential power rail; and
   b. a second NMOS transistor having a gate coupled to said low-potential rail, a drain coupled to the second node, and a source coupled to said first pseudo low-potential power rail.

15. The bus switch as claimed in claim 14 wherein said third arbiter circuit includes:
   a. a first NMOS transistor having a gate coupled to the first node, a drain coupled to said low-potential rail, and a source coupled to said second pseudo low-potential power rail; and b. a second NMOS transistor having a gate coupled to said low-potential rail, a drain coupled to the first node, and a source coupled to said second pseudo low-potential power rail.

16. The bus switch as claimed in claim 15 wherein said fourth arbiter circuit includes:
   a. first NMOS transistor having a gate coupled to the second node, a drain coupled to said low-potential rail, and a source coupled to said second pseudo low-potential power rail; and
   b. a second NMOS transistor having a gate coupled to said low-potential rail, a drain coupled to the second node, and a source coupled to said second pseudo low-potential power rail.

* * * * *